US007478281B2

(12) United States Patent
Denniston

(10) Patent No.: US 7,478,281 B2
(45) Date of Patent: Jan. 13, 2009

(54) SYSTEM AND METHODS FOR FUNCTIONAL TESTING OF EMBEDDED PROCESSOR-BASED SYSTEMS

(76) Inventor: William B. Denniston, 1510 Casa de Ponselle, San Jose, CA (US) 95118

( * ) Notice: Subject to any disclaimer, the term of this patent is extended or adjusted under 35 U.S.C. 154(b) by 414 days.

(21) Appl. No.: 11/447,181

(22) Filed: Jun. 5, 2006

(65) Prior Publication Data

US 2007/0011522 A1 Jan. 11, 2007

Related U.S. Application Data

(60) Provisional application No. 60/687,736, filed on Jun. 6, 2005.

(51) Int. Cl.
*G06F 11/00* (2006.01)
(52) U.S. Cl. .......................... 714/31; 714/734
(58) Field of Classification Search .................. 714/31, 714/32, 37–38, 724, 733–734; 717/124, 717/126, 127, 134, 135, 140
See application file for complete search history.

(56) References Cited

U.S. PATENT DOCUMENTS

| | | | |
|---|---|---|---|
| 4,622,647 A | 11/1986 | Sagnard et al. | |
| 5,004,978 A | 4/1991 | Morris, Jr. et al. | |
| 5,032,789 A | 7/1991 | Firooz et al. | |
| 5,323,108 A | 6/1994 | Marker, III et al. | |
| 5,715,254 A | 2/1998 | Whetsel | |
| 5,828,825 A * | 10/1998 | Eskandari et al. | 714/27 |
| 5,909,544 A * | 6/1999 | Anderson et al. | 709/208 |
| 6,134,690 A * | 10/2000 | Ivaturi et al. | 714/736 |
| 6,941,499 B1 * | 9/2005 | Sung et al. | 714/741 |
| 7,036,062 B2 | 4/2006 | Morris et al. | |
| 2005/0166094 A1 * | 7/2005 | Blackwell et al. | 714/38 |

* cited by examiner

*Primary Examiner*—Dieu-Minh Le
(74) *Attorney, Agent, or Firm*—NewTechLaw; Gerald B. Rosenberg, Esq.

(57) ABSTRACT

Functional testing of an embedded system is performed by a test control system that implements a peripheral emulation module to interface with an externally accessible port of the embedded system. The test control system implements a test generation processor that operates to autonomously resolve abstracted component templates and embedded system description data, specific to the embedded system, to produce a corresponding specific test program. The test control system executes the test program to drive operation of the embedded processor unit to cause transfer of test data through the external interface, which is then autonomously compared to reference data derived through the execution of the test program and specific to the embedded system, whereby the comparison results reflect the correct operation of the embedded system.

18 Claims, 5 Drawing Sheets

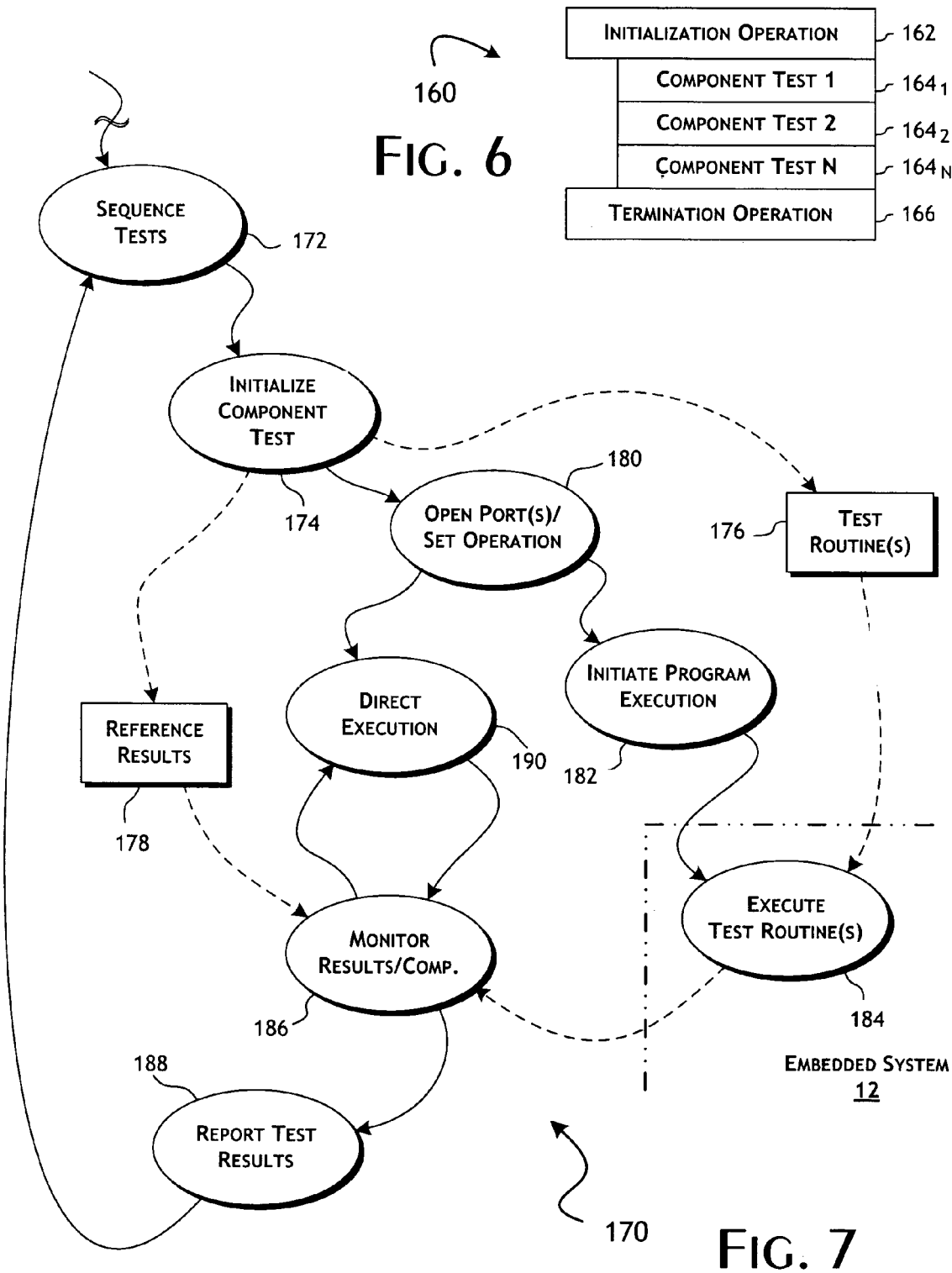

SYSTEM AND METHODS FOR FUNCTIONAL TESTING OF EMBEDDED PROCESSOR-BASED SYSTEMS

This application claims the benefit of U.S. Provisional Application No. 60/687,736, filed Jun. 6, 2005.

BACKGROUND OF THE INVENTION

1. Field of the Invention

The present invention is generally related to automated embedded computer test systems and in particular to a test system implementing automated functional testing, including test case generation, execution, and result verification, of embedded processor systems.

2. Description of the Related Art

Efficient and effective testing of embedded computer systems, whether in design or manufacturing verification or in failure analysis contexts, continues to be problematic for a variety of reasons. Perhaps the foremost reason is the already substantial and continually increasing complexity and density of embedded processor systems. Other reasons include the practical consequences of variant designs and, in the extreme, designs subject to frequent and significant design revision. That is, where a base embedded system design is engineered to support multiple feature sets or where fundamentally new designs are introduced into the testing regime, the corresponding complex of testing procedures must adapt accordingly. Often, such changes require significant re-engineering of the test procedures and extensive re-validation of reference test results, both of which are often considerably time and cost-intensive.

Traditionally, testing systems implement in-circuit testing (ICT) in order to qualify the operational behavior of the components that comprise some typically board-level product. In the particular case of embedded processor-based systems, which typically include an embedded processor, on-board firmware and local memory, and associated set of highly integrated peripheral components, standard in-circuit testing approaches seek to effectively isolate each component for testing as a functional unit. Conventional in-circuit testing systems will often utilize a so-called "bed-of-nails" platform to obtain simultaneous electrical access to upwards of 7,000 discrete contact points on an embedded system circuit board. With the prevalence of multilayer boards and highly integrated components using ball-grid-array (BGA) and other hidden contact packages, as well as double-sided mounting, meaningful electrical access to individual components is often quite limited.

Where testing of individual components is not possible, related components are conventionally segregated into distinct clusters for functional testing as a unit. Traditionally, substantial engineering time is required to both identify testable clusters and, further, identify the operational dependencies of each cluster on the surrounding circuits and components. Since a cluster remains connected with its surrounding circuitry, the functional testing of the cluster must account for limitations on how the cluster can be driven without damaging other components and how output contact points within the cluster will be affected by connection to other circuitry external to the cluster.

In-circuit testing is further complicated whenever design changes occur. Any design change external to a cluster will require re-analysis of dependencies between the external and cluster internal components. Equally, any design change within a cluster, whether by alteration of an existing component or introduction of additional components will frequently require a re-analysis and identification of the testable clusters. These problems are both commonly encountered and long appreciated. U.S. Pat. No. 5,004,978, issued to Morris, Jr. et al., describes a method of automatically identifying dependency changes, due to design alterations, that will affect a given cluster. The identified dependency changes are also utilized to determine how to functionally drive the cluster and the sequencing of input signals that will exercise the function of the cluster.

Similarly, U.S. Pat. No. 5,323,108, issued to Marker, III et al., describes a method of recognizing clusters based on a pattern matching of models used to describe the interconnected collection of components within clusters. Where a design modification is made, as when a new embedded system is presented for test, different collections of components are scanned to locate best matches with generic component models previously established and stored for reference. Any remaining components are individual matched to generic models. Consequently, a significant portion of the engineering effort to identify clusters can be automated. Even so, automated identification of clusters remains time intensive and still requires specific details of the clusters and individual components to be hand edited into the specific instance set of models that describe the specific embedded system.

Boundary scan is a well-developed technology that can be used to functionally increase the available test points within an embedded system accessible for in-circuit testing (IEEE 1149.1-2001, "Test Access Port and Boundary-Scan Architecture," available from the IEEE, 445 Hoes Lane, PO Box 1331, Piscataway, N.J. 08855-1331, USA or http://standards-.ieee.org/catalog, developed by the Joint Test Access Group (JTAG)). The boundary scan standard, initially established in 1990 and subsequently revised and expanded in 2001, has been progressively adopted by different integrated circuit manufacturers. To comply with the standard, an integrated circuit device must physically include a standard-defined 4-wire test access port (TAP), internal boundary-scan cells for each pin, and associated internal boundary-scan registers and other circuitry. A boundary scan description language (BSDL) file is provided by the manufacturer to describe the boundary-scan testable device functions available for use in testing.

Conventionally, the TAP ports of the devices are connected in a serial chain that is accessible through test-point pins commonly referred to as a JTAG interface. Thus, by writing and reading test data vectors through a JTAG interface, different boundary-scan cells, each associated with some device pin, can be driven and queried as part of an in-circuit test procedure. While boundary scan test techniques can be used alone, or "fixtureless," boundary-scan is frequently used in combination with bed-of-nail platforms to reduce the size and complexity of component clusters. Even with reduced cluster size and complexity, however, conventional test systems utilizing boundary scan techniques still require time and engineering intensive cluster identification and dependency analysis.

Traditionally, circuit and systems level testing is performed initially for design verification and, subsequently, for manufacturing verification as an integral step in the production process. Further testing will be later performed for failure analysis of products returned due to, or at least suspected, in-field failure. Often, quite different test systems are used in each context to meet the different performance and commercial requirements that exist in each context. In particular, manufacturing verification requires expedient testing to support the manufacturing run rates necessary for cost-effective production. Test speed must be balanced against thoroughness to ensure that manufacturing yields are sufficient to minimize the cost of post delivery customer support and product returns. In many cases, a yield improvement of just a few percent may determine the overall profitability of a given product. Consequently, manufacturing verification testers, particularly where the product produced is a complex embedded processor system, are conventionally dedicated, large-scale, and expensive test systems.

Consequently, there is a need for an effective and efficient test system capable of at least manufacturing verification test use and readily adaptable to implement test changes and corresponding result analysis to for new designs and incremental design variations without incurring significant time and engineering costs.

SUMMARY OF THE INVENTION

Thus, a general purpose of the present invention is to provide an efficient system capable of supporting comprehensive functional testing in at least a manufacturing verification role.

This is achieved in the present invention by providing for the functional testing of an embedded system by a test control system that implements a peripheral emulation module interfaced with an externally accessible port of the embedded system. The test control system implements a test generation processor that operates to autonomously resolve abstracted component templates and embedded system description data, specific to the embedded system, to produce a corresponding specific test program. The test control system executes the test program to drive operation of the embedded processor unit to cause transfer of test data through the external interface, which is then autonomously compared to reference data derived through the execution of the test program and specific to the embedded system, whereby the comparison results reflect the correct operation of the embedded system.

An advantage of the present invention is that comprehensive functional testing can be performed on embedded systems including those embedded components supporting external data and control interfaces and embedded components providing only internal support functions. Functional tests apply unidirectional and, as applicable, bidirectional control signal and data transfers to enable full verification of the control and data paths between the embedded CPU and externally accessible physical port connectors. The function of internal components is comprehensively tested through interoperation with the embedded CPU.

Another advantage of the present invention is that the implemented functional testing is dynamically adaptable both in terms of the complexity and ordering of the functional test sequences and specific operational test parameters used to qualify component and system specific test implementation and execution. Abstract descriptions of well-defined components, stored as templates, are drawn together through a dynamic functional test generation process that produces a tailored set of test routines and expected test reference results. Dynamic modification of the test sequence and parameters are automatically reflected in the generated test routines and reference results, allowing fully automated determination of test completion status.

A further advantage of the present invention is that functional test programs can download and monitor test routines executed directly on the system under test. Such direct test execution achieves functional testing at full test system speed. Alternate test routines can directly access embedded components and further control the embedded system processor to directly manage and functionally step through appropriate test operations.

Still another advantage of the present invention is that test operations can be readily tailored to support use in significantly different test modes, including manufacturing verification, design verification, and failure analysis. Dynamic selection of different test sets and dynamic qualification of individual tests and test sets, particularly with regard to scope, functional completeness, and reporting, is supported by the present invention. Automated results analysis, even in the presence of dynamically modified tests, is supported by the automatic preparation of expected test results in direct correspondence with the generation of the modified functional test routines. Results can be automatically reported simply by a component by component pass/fail indication, as may be particularly appropriate for manufacturing verification, or in extended detail variously appropriate for use in design verification and failure analysis use.

BRIEF DESCRIPTION OF THE DRAWINGS

FIG. 6 is a block diagram illustrating a preferred structure of a functional test sequence as implemented in accordance with a preferred embodiment of the present invention; and FIG. 7 is a software flow diagram detailing a preferred operational execution of functional test routines in accordance with a preferred embodiment of the present invention.

DETAILED DESCRIPTION OF THE INVENTION

The present invention is primarily directed at providing efficient, highly automated and effective functional testing of embedded systems particularly in the context of manufacturing verification. Test systems implementing the present invention, however, can be readily used for or in support of design verification and failure analysis testing of embedded systems. In each case, to support functional testing in accordance with the present invention, a microprocessor or other automated controller is generally utilized to assist or perform functional testing of the various component parts of the embedded system. The present invention is not, however, limited to conventional programmable micro-processors, but is applicable generally to embedded systems implementing controllers that can be externally managed and, preferably, programmed to drive operation of embedded support components and components supporting externally accessible data and control ports.

Figure 1:
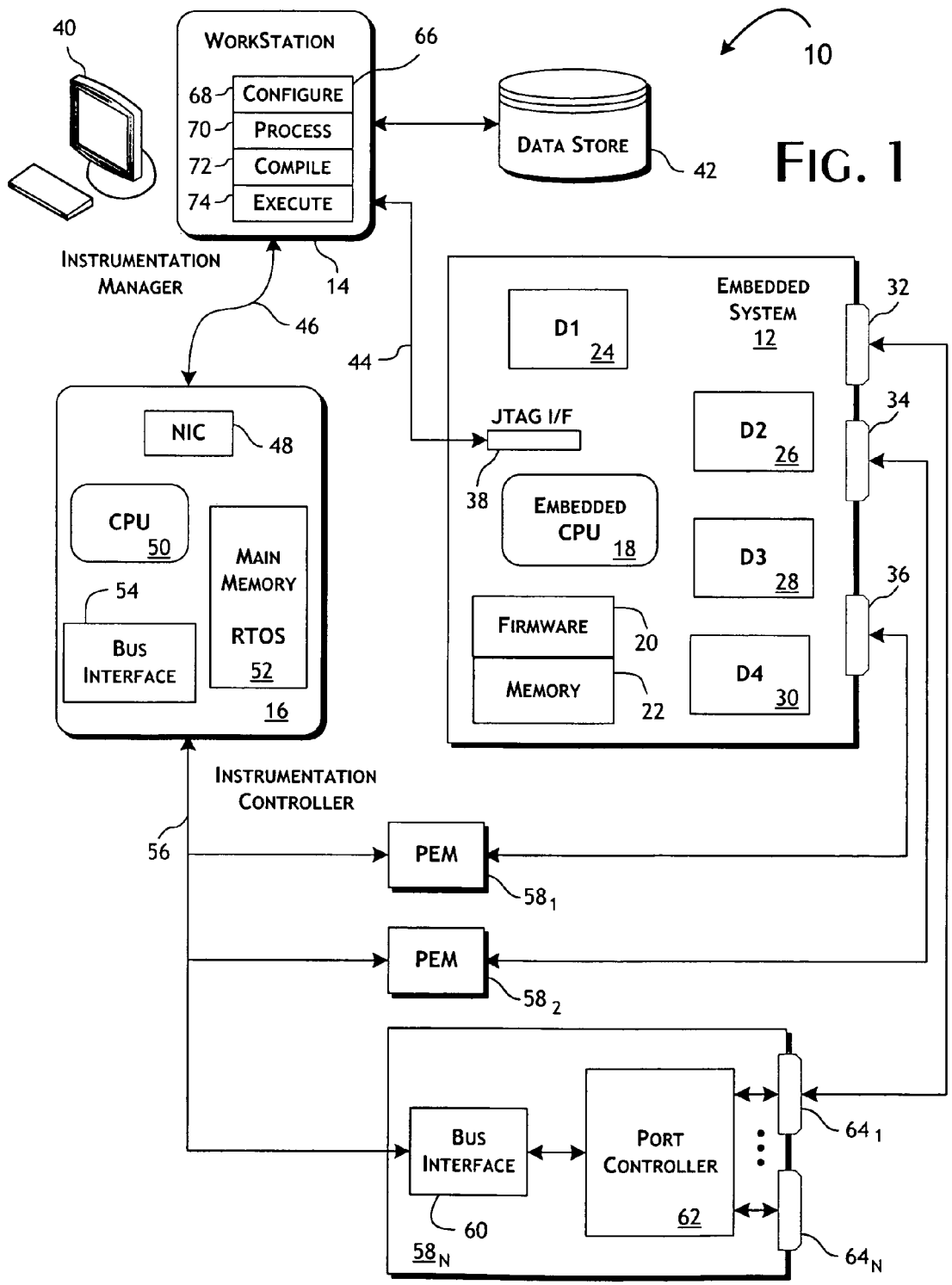
FIG. 1 provides an architectural block diagram of a functional verification test system implemented in accordance with a preferred embodiment of the present invention.

A test system 10, generally representing a preferred embodiment of the present invention, is shown in FIG. 1 in combination with an embedded system 12 interconnected for functional testing. The test system 10 preferably includes an instrumentation manager 14, used to construct and manage the execution of test operations, and instrumentation controller 16, used to monitor and manage the transfer of control and test data through the embedded system 12. In the following detailed description of the invention, the embedded system 12 is generally representative of the embedded systems testable utilizing the present invention. This representative embedded system 12 preferably implements a programmable processor 18 with associated firmware 20, and local memory 22. The present invention is equally applicable to other embedded systems 12 incorporating multiple processors 18 of similar or different type, including for example digital signal processors and dedicated programmable coprocessors that share the local memory 22 space or support separate addressable memory spaces. The representative embedded system 12 further includes peripheral components 24, 26, 28, 30 variously supporting internal operation (D1) of the embedded system 12 and external interfaces (D2, D3, D4). For example, an internal support component 24 can provide a clock/timer, interrupt controller, or similar function that, while functionally visible to the processor 18 and other embedded components, is not nominally accessible external to the embedded system 12. Peripheral components 26, 28, 30 preferably implement industry standard interface ports, including for example, Ethernet, GPIB, IEEE-1284 and GPIO parallel, USB, IEEE-1394, and RS-232 serial, standard audio and other D/A and A/D functions, and other typically well-defined interface ports that are externally accessible through physical connectors 32, 34, 36. For purposes of the present invention, embedded test points and non-standard ports can be viewed as a collection of general purpose digital I/O signal lines.

External access to and functional control of the processor 18, for the preferred embodiments of the present invention, is preferably provided by provision of a conventional JTAG-based instrumentation interface 38 integral to the design of the embedded system 12. Other specific instrumentation interfaces 38, such as the Motorola® defined Background Debug Mode (BDM), may be used. Alternately, access and control of the processor 18 can be obtained through other standard instrumentation practices, as may be implemented through use of a conventional diagnostic probe fixture that directly attaches to the processor 18. Where such additional connections are not possible or desired, a verification monitor can be uploaded to and executed by the processor 18 to enable control communications through a peripheral component 26, 28, 30. This alternative preferably utilizes a resident power-on monitor routine, executed from the firmware 20, to load and initiate execution of an externally provided verification monitor that logically allows control generally equivalent to an instrumentation interface.

In an initial embodiment, the instrumentation manager 14 is preferably based on an industry standard personal computer platform, including user display 40 and persistent storage 42, utilizing an Intel® Pentium 4™ microprocessor and executing a Microsoft® Windows XP™ operating system. Unix®, Linux™, and other variants of the Windows operating system could be used. For the preferred embodiments, the instrumentation manager 14 includes a standard instrumentation port 44, allowing connection to the JTAG instrumentation interface 38 present on the embedded system 12. A network connection 46 is preferably provided to enable control and data communication with the instrumentation controller 16.

The instrumentation controller 16 is preferably implemented in the initial embodiments of the present invention using a dedicated single board processor platform of conventional design that hosts execution of a real-time operating system (RTOS). The eCos RTOS, available under a GNU GPL open source license (http://ecos.sourceware.org), is preferably used to control the instrumentation controller 16. A commercial RTOS, such as VxWorks™ available from Wind River, Inc., Alameda, Calif., could also be used. The instrumentation controller 16 platform preferably implements a standard network interface controller (NIC) 48, host processor 50, a firmware monitor supporting booting from a locally attached data storage device (not shown) or through the network connection 46, local memory 52 enabling execution of the RTOS, and an I/O bus interface 32, preferably implementing the compact peripheral component interconnect (cPCI) bus 56.

In accordance with the present invention, each of the interface ports 32, 34, 36 are connected to the instrumentation controller 16 through a peripheral emulation module (PEM) $58_{1-N}$. Different PEMs 58 are provided to handle different interface port types. Typically, each PEM $58_{1-N}$ will support a single interface port type, though potentially providing multiple physical connectors to allow convenient connection to the port connectors 32, 34, 36 actually provided by any particular instance of the embedded system 12. Additionally, the PEMs $58_{1-N}$ can implement multiple port instances. As illustrated by the PEM $58_N$, each PEM $58_{1-N}$ preferably implements a bus interface 60 and a port function specific controller 62 that internally supports one or more independently functioning ports accessible through corresponding physical port connectors $64_{1-N}$. Thus, for example, a single PEM 58 could implement one or more Intel® 82546EB dual port gigabit ethernet controllers as controller 62 to provide functional test support for multiple ethernet controllers implemented in the embedded system 12. A standard complement of preferably cPCI bus 56 slots thereby enables ready configuration of PEMs $58_{1-N}$ to provide whatever number and type of interface ports are needed to functionally match all of the interface ports 32, 34, 36 provided by a particular instance of the embedded system 12. A preferred set of PEMs is listed in Table I:

TABLE I

Peripheral Emulation Modules

| Function | Port Count |
|---|---|
| Keyboard/Mouse | 3 ports |
| USB Serial | 4 ports |
| RS-232 Serial | 2 serial ports and 1 IrDA port |
| Parallel | 1 port |
| IEEE 1394 Firewire | 4 ports |
| Ethernet LAN | 4 10/100 ports |
| Ethernet Traffic Generator | 8 10/100 ports |
| SCSI | 1 port |
| IDE | 1 port |
| Video | 1 port |
| LCD | 1 port |
| Audio | 3 outputs driven by tone generator 3 inputs |
| Modem line simulator | 1 port |
| Battery Emulator | 1 port |
| Switch Card | 16 power relays |
| GPIO | 1 port (256 connections) |
| Analog/Digital I/F | 1 port - 8 DAC output channels 1 port - 16 ADC input channels |

For the initial preferred embodiment of the present invention, the instrumentation manager 14 is provided with a control system 66 that implements the primary processes of the present invention. The control system 66 is preferably executed as a sequence of stages. A first stage, represented as configuration stage 68, provides for the creation and modification of a board description reflecting the particular component oriented design of a corresponding embedded system 12. A pre-processing stage 70 preferably provides for a resolving of a selected board description into a test specification that is, in a compilation stage 72, used to define the structure and content of an executable test program specific to the design of the corresponding embedded system 12. An execution stage 74 then executes the test program to drive the operation of the embedded system through a series of functional tests. Dependent on the test functions compiled into the test program, execution of the test program will drive operative tests of the components 18, 20, 22, 24, 26, 28, 30, to verify operation internal to the embedded system 12, and further test the operational function of the external interface supporting peripheral components 26, 28, 30 externally through the interface ports 32, 34, 36 to the instrumentation controller 16 through the connected peripheral emulation modules (PEM) $58_{1-N}$. The test program is thus able to comprehensively test the embedded system 12 as a whole.

In accordance with the present invention, the configuration stage 68 supports user interaction to establish an initial board design definition, define one or more test configurations, and select various control parameters of the functional tests to be generated. The board definition preferably describes a comprehensive or fully populated components and ports configuration of the embedded system 12. The test configurations each specify a board variant, the scope of tests to be performed in any given test run and a chosen set of test control parameters. The board design and test configurations are preferably persisted to the data store 42 allowing for subsequent modification and use.

Once a user initiates a test run against an embedded system 12, typically by creating or choosing an existing test configuration and making any final test run specific changes to the applicable test control parameters, the remaining stages 70, 72, 74 are preferably performed automatically. The test program is automatically constructed dependent on the specific contents of the chosen test configuration, test configuration referenced board description and the test control parameters stored with the test configuration and board description. Any test control parameters dynamical added or modified by the user override the corresponding prior chosen or default test control parameters.

The test program is also preferably constructed to concurrently manage the operation of the instrumentation controller 16 to, as needed, bidirectionally transfer data and control signals through the various interface ports 32, 34, 36 to enable complete path functional testing of the external interface components 26, 28, 30. For internal components 18, 20, 22, 24, the test program is constructed to both drive and read back data and control signals through the JTAG instrumentation interface 38. Dynamic generation of the test program enables specific, customized selection of the functional tests to be executed against the embedded system 12. Dynamic generation also enables determination and functional incorporation of customization dependent reference results into the test program. Thus, in accordance with the present invention, the test system 10 implements comprehensive dynamically specified functional testing of an embedded system 12 that includes a fully automated determination of the success or failure of the individual functional tests of the embedded components 18, 20, 22, 24, 26, 28, 30.

In an alternate embodiment of the present invention, the execution stage 74 may be moved in substantial part from the instrumentation manager 14 to the instrumentation controller 16. The instrumentation port 44 is also moved to the instrumentation controller 16. This allows the test run to be largely driven by the instrumentation controller 16, through primary execution of the test program, while execution of a retained portion of the test program on the instrumentation manager 14 performs test run initiation and result monitoring. In this embodiment, multiple instrumentation controllers 16 can be supervised from a single instrumentation manager 14 in concurrently testing multiple embedded systems 12, as may be particularly desirable in a high-volume manufacturing verification context.

Figure 2:
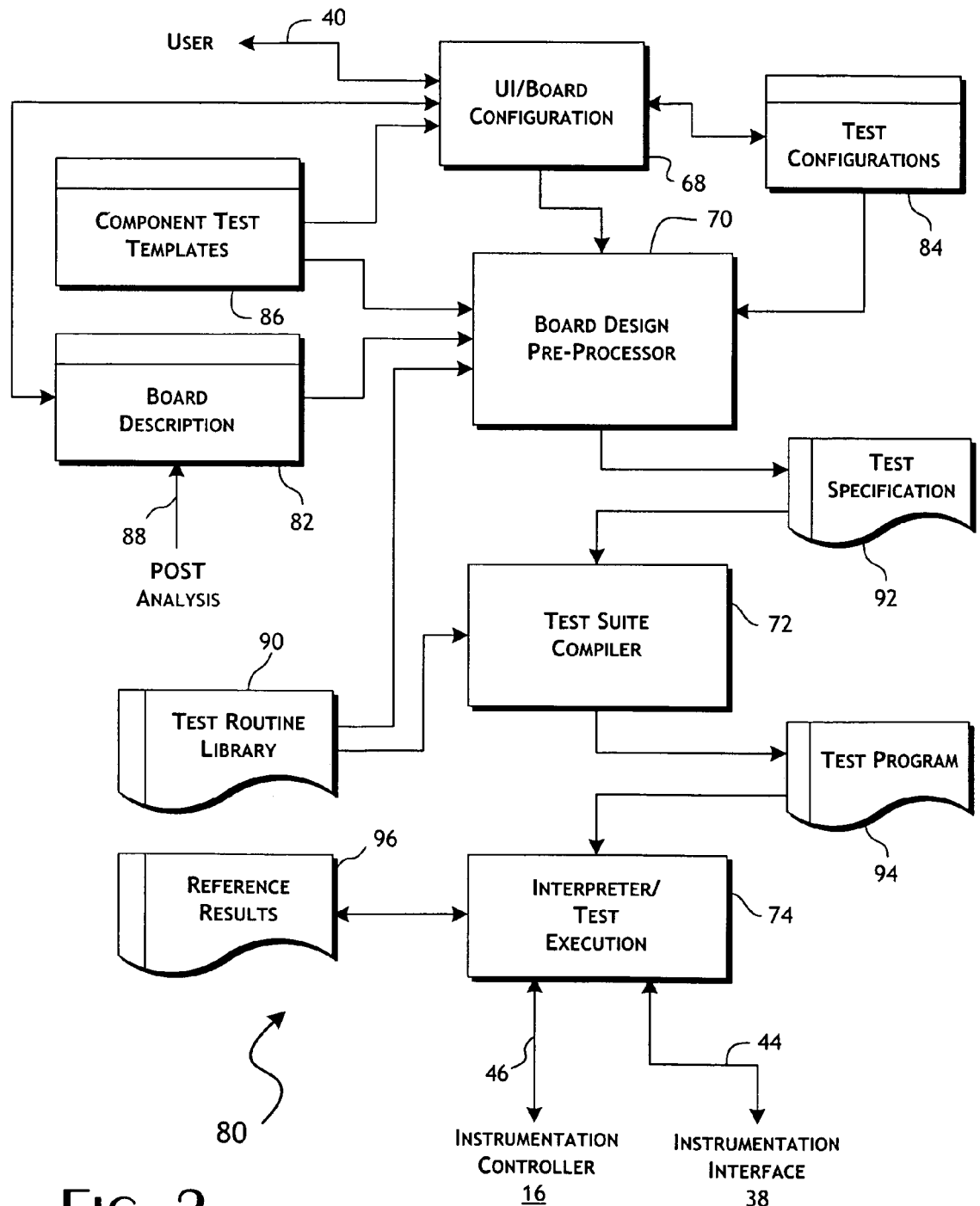
FIG. 2 is an architectural block diagram illustrating a preferred implementation of an instrumentation manager in accordance with the present invention.

A preferred implementation 80 of the control system 66 is shown in FIG. 2. The board design and test configuration stage 68 enables interactive selection, construction, derivation, and modification of board description files 82 and test configurations 84 by a user 40 through user interface dialogs. The board descriptions 82 and test configurations 84 are preferably maintained as database records stored in the data store 42. Component test templates 86, which contain functional descriptions of the testable features and functions of corresponding components, are also preferably stored as database records in the data store 42.

In accordance with the present invention, board descriptions 82 preferably contain an abstracted component description for each testable component present in a corresponding embedded system 12. Each abstracted component description preferably includes a component type identifier usable to reference a specific component template 86. The board descriptions 82 also contain test control parameters that functionally define how the components are configured within embedded systems 12 including, typically, the corresponding processor base addresses of the components, applicable addressing modes required by the embedded processor 18 to communicate with a particular component, and such other specific information that describe the design time options for inclusion of the component within a generic embedded system design. The test configurations 84, in turn, are preferably used to specify different combinations of the tests to be executed.

The component templates 86, referenced by the component type identifiers of the abstracted component descriptions included in a board description file 82, each preferably correspond to a single, distinct component 18, 20, 22, 24, 26, 28, 30. Each component template incorporates the specific functional strategies available for testing the corresponding component. That is, a typical component template will contain a functional description of the internal registers presented by the component, various register values that can be used to establish register settings and to compare against to check for specific operational states, and the abstracted logic appropriate to sequence these values and checks to implement functional tests of the component.

The functional testing strategies defined in the component templates 86 are further abstract in that they are essentially independent of the design constraints imposed by any particular design within which the component is implemented. Thus, for example, register addresses are specified by offset rather than absolute value. Functional strategies are generalized to test all aspects or elements of a component, rather than just those that might be applicable in a limited design or test environment. The abstract test strategies defined for any given component will naturally depend on the function and typically register-based implementation of the component itself. In typical implementation, the test strategies will specify the performance of read, write and control operations analogous to a POST test for the component.

Thus, for an exemplary dynamic RAM memory management unit, the abstract test strategies specified by the corresponding component template will preferably specify register checks for read/write functionality, a programming of the timing registers to supported DRAM operation values, and a memory scan using test control parameter supplied memory size and data values. For an exemplary external port controller, the test strategies will also preferably specify register checks for read/write functionality, appropriate register programming to support external data and control operations dependent on supplied test control parameters preferably including data transfer sizes and value patterns, and procedures to perform a corresponding series of data and control operation tests.

In current embodiments, multifunction components, which contain various collections of the individual on-chip peripherals, are preferably treated as a set of individual components. Different component templates will be identified for the different on-chip peripherals. In alternate embodiments, the component template for a multifunction component can contain nested references to the various component templates that correspond to the particular included on-chip peripheral components.

The component templates 86 can further include, directly or by reference, program code test routines that are executable on-board embedded system 12 to test specific functions and features of the component. In the preferred embodiments of the present invention, the test routines are pre-compiled, with different instances for different tests compiled for use dependent on the specific type of the processor 18. In alternate embodiments, the program code for the test routine instances can be compiled on demand to produce binary executables specific to test and processor type. In either case, the program code implementing a particular test routine may be as short as a single instruction, used for example, to check a single component value, or a lengthy series of instructions that, on execution, provide for initialization of an on-board test environment within which to perform the test and to collect and return test status and results. Functional logic stored by the component templates in combination with the test routines can define the sequenced execution of test routines, with test routine selections being conditioned on the exit results of prior test routines. Thus, test routines can be utilized alone or in sequence to perform setup for component specific tests, execute single instructions or monitor a direct instrumentation port driven function, perform repetitive and time dependent tests, perform a post-test review of the embedded system 12 state, and reset or restore the test environment within the embedded system 12.

A separate board description 82 is preferably defined for each base model of an embedded system 12. The board description 82 for a given embedded system 12 contains the full set of abstracted component descriptions for all of the testable components that may be present. For example, an abstracted component description of the embedded processor 18 will identify the specific processor type and further design variable details, such as addressing mode and clock speed, and function defining information, such as microcode revision as implemented in the specific design of the embedded system 12. For an internal support component 24, such as an interrupt controller, the abstracted component description will identify the specific interrupt controller type and the base register address of the controller within the address space of the embedded processor 18. For RAM, ROM, flash, EPROM, and other memory types, the abstracted component description will define the memory size, speed and read/write or read-only capability. In the case of more complex components, such as a dynamic RAM memory management unit, the abstracted component description will also specify the full required set of initialization information, such as an appropriate set of refresh timing control parameters. For an external interface component 32, 34, 36, such as a USB controller, the abstracted component description will typically identify specific serial controller type, the base register address of the controller within the address space of the embedded processor 18, and, the number and relative address of the ports actually implemented by the embedded system 12, particularly where the controller component internally may support a greater number of interface ports.

Much of the abstracted component descriptions for a given embedded system 12 can be derived from an automated monitoring 88 of the power on self test (POST) operation of an embedded system 12. Given a basic identification of the various components present in an embedded system 12, the instrumentation manager 14 can observe through the instrumentation interface 38 the sequence of component register accesses and the values programmed by the POST routine. While the pattern of register address offsets and the details of the operations performed against the registers may be sufficient to uniquely identify component types, user interaction is contemplated to aid in component identification at least sufficient to verify component identities and establish the base register addresses of the different components. Once sufficient component-related information is collected, the POST implemented detailed initialization of the various components can be recognized and recorded to establish initial abstracted component descriptions. For example, the POST initialization of a dynamic RAM memory management unit can be examined to identify refresh timing values, the programming of an interrupt controller will define the location of a firmware-based interrupt table, the programming of a timer controller will define the clock rates supplied to other components, and the programmatic disabling of ports otherwise available in a peripheral component can be used to automatically determine which ports are externally implemented. Control parameters, such as the base address and size of a local memory space, can also be determined by monitoring the individual test routines performed by the POST.

Test control parameters stored within the test configuration files 84 are used preferably to sub-select sets of the abstracted component descriptions of a particular board description 82 to define testable board variants. For purposes of the present invention, board variants exists where alternate sets of specific components may be used in the implementation of a particular embedded system 12, such for example as where a given board may be populated in the alternative with any of several functionally equivalent, but specifically different components including none at all. Test control parameters can also further characterize, including re-characterize, the implementation of an embedded system 12 as defined by a particular board description file 82. The test control parameters provided as part of a test configuration file 84 can supplement and override various values of the abstracted component descriptions. For example, a test configuration file 84 can be used to provide additional memory controller refresh timing control values as needed specific to the type of memory chips used in a particular variant. A default clock speed value for a timing controller component, as set in the corresponding abstracted component description, can be overridden in a test configuration file 84 to match the processor 18 speed in a particular variant.

The test control parameters stored by test configuration files 84 are preferably also used to specify the set or subset of tests that are to be run for each component identified within a corresponding board description file 82. For functional testing, particularly in a production manufacturing context, a comprehensive test of all possible operating modes of the components present in the embedded system 12 may not be necessary or desirable. Also, all tests for components identified in a board description file 82 but not present in the current embedded system 12 variant being tested are excluded preferably by reference omission from the corresponding test configuration file 84. Finally, the test control parameters can be used to specify the number of times a particular test is to be run against a given component, the test control parameters can be further used to specify the type and characterize the extent of tests to be performed against a given component. That is, for example for a USB controller, test control parameters can be provided to specify whether both USB 1.1 and 2.0 standard transfer rates are to be tested, the quantity of data to be transferred, whether bidirectional transfers are to be performed, and the number of test iterations. Test control parameters can also be used to specify particular data patterns that are to be used or controls on the manner of progressive generation of data. Acceptable data error rates, extent of delays or number of retries in control operations, and percentage of target data transfer rates achieved are also preferably specified as test control parameters.

The pre-processing stage 70 dynamically constructs an embedded system test specification 92 based on the board description 82 and test configuration 84 for a variant specific embedded system 12. Component templates 86 internally referenced by the board description 82 and test routines, included in the component templates 86 or stored 42 externally in a test routine library 90, are read in by the pre-processing stage 70 as needed. In the preferred embodiments, the pre-processing stage 70 is implemented using a standard lexical preprocessor program taking abstracted component descriptions and test control parameters as preprocessor statements and values to select, by component type identifier, and further define and qualify the test strategies embodied by the component templates. As implemented for the preferred embodiments, the component templates contain typical or default values for most of the values provided by way of the abstracted component descriptions and test control parameters. Where a default value is not provided by a component template, the board configuration stage 68 will require the user to provide a value. Thus, the values provided by the abstracted component descriptions and test control parameters operate as overrides, preferably passed as environment variables and values, applied as preprocessor directives in the construction of the test specification 92. Further overriding values may be provided dynamically by the user to further and specifically customize a particular test execution.

While a test specification 92 could be persisted to the data store 42 for subsequent use, a prepared test specification 92 is preferably passed automatically from the preprocessor stage 70 as a dynamic data structure to the compilation stage 72. In general, the compilation stage 72 compiles the test specification 92, optionally compiling and incorporating, as needed, test routines provided in or referenced from the included component templates 86 or retrieved from the test routine library 90, into an executable test program 94. In the initial embodiments of the present invention, the compilation stage 72 provides for the generation of a byte code-based test program 94, rather than a natively compiled program, that includes as data objects the binary compiled test routines.

The execution stage 74 preferably manages the execution of the test program 94. As with the test specification 92, the test program 94 could be persistently stored prior to execution. Preferably, however, the test program 94 is passed as a dynamic data structure to the execution stage 74. In the initial embodiments of the present invention, the execution stage 74 is implemented using a byte-code interpreter to host execution of the test program 94. Through the byte-code interpreter, an executing test program 94 is able to issue commands and bidirectionally transfer data with the instrumentation controller 16 and instrumentation interface 38. Throughout execution of the test program 94, reference results for the control and data operations used in implementing the different component tests are determined and held as reference results 96 pending retrieval of the actual results of the control and data operations performed through the embedded system 12.

Figure 3:
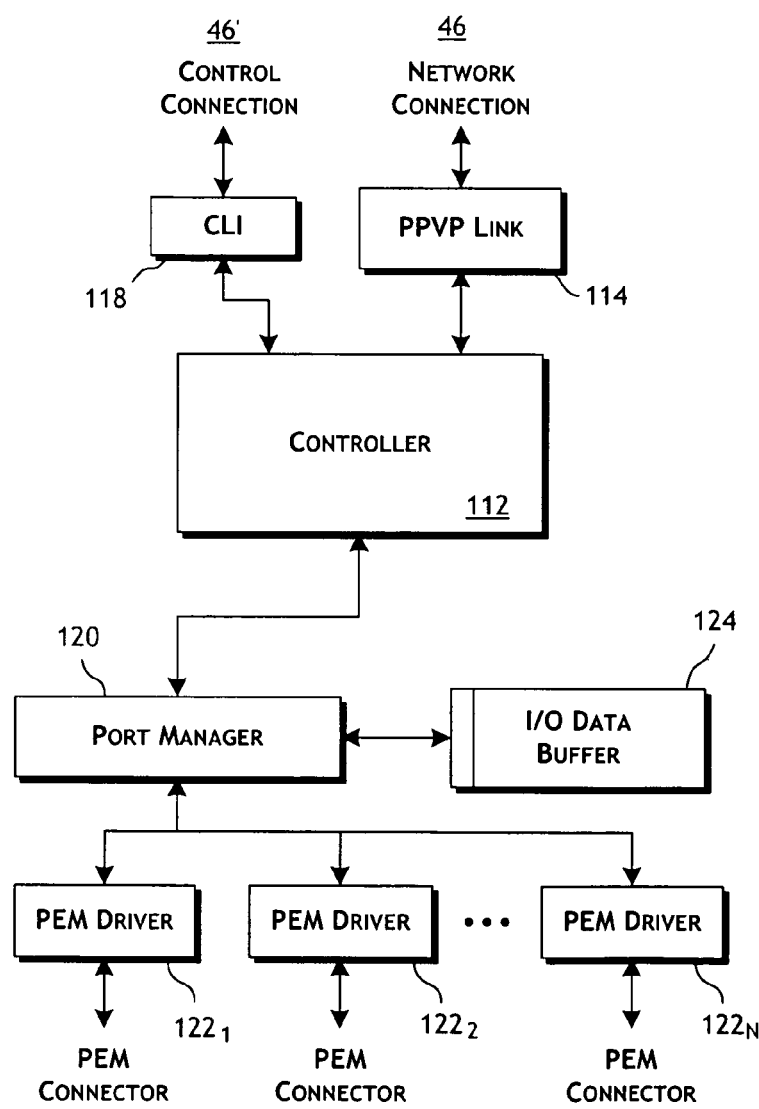
FIG. 3 is a block diagram of a preferred interface utilized to provide control and data transfers with respect to a system under test as implemented in a preferred embodiment of the present invention.

FIG. 3 provides a block diagram detailing the connection between the execution stage 74 and instrumentation interface 38 as implemented in a preferred embodiment of the present invention. For the JTAG-based instrumentation interface 38, a JTAG control library 102 provides byte-code selectable functions that enable the execution stage 74 to manage operation of the embedded processor 18 and generally read and write data to test program specified memory and I/O mapped addresses. A preferred set of JTAG control functions pre listed in Table II:

TABLE II

| JTAG Control Functions | |
|---|---|
| int TargBreakCount( ); | Returns count of breakpoints |
| int TargBreakDelete(int i); | Remove breakpoint i |
| int TargBreakEnable(int i); | Enable a software breakpoint |
| int TargBreakHide(int i); | Disable a software breakpoint |
| int TargBreakSet(ID, addr); | Set target breakpoint ID at address. Next avail if ID is 0. Returns breakpoint index. |
| int TargBreakStatus(int i, addr); | Return 0-unused, 1-enabled, 2-hidden |
| int TargAPI( ); | Toggle display of codes exchanged with target. |
| int TargAttach(0); | Initialize the target processor. Use TargComm( ) first. Returns driver error status. |
| int TargComm(0); | Connects to the target interface device. Returns driver error status. |
| int TargDetach(0); | Disconnect from target communication link. Returns driver error status. |
| int TargMem(addr, value); | Writes one word |
| int TargMem(addr, &value); | Reads one word |
| int TargMemRead(addr, int count, value); | Count is number of values. Value is array of ubyte, ushort, uint, ulong. Returns driver error status. |
| int TargMemWrite(addr, int count, value); | Count is number of values. Value is array of ubyte, ushort, uint, ulong. Returns driver error status. |
| int TargReg(uint reg1, value) | Sets register. |
| int TargReg(uint reg1, &value) | Reads register. |
| int TargRegRead(uint reg1, uint regn, int count, values); | Reads array of values from registers. Returns driver error status. |
| int TargRegWrite(uint reg1, uint regn, int count, value); | Writes array of values to registers. Returns driver error status. |
| int TargLoad(string path, offset); | Download test routine from file at path. Add offset to all addresses. |
| int TargCopy(astart, aend, adest); | Copy data from astart-aend to adest. Returns driver error status. |
| int TargFill(start, end, value); | Fill memory from start to end with value. Returns driver error status. |
| int TargFunc(int f, string p); | Target specific function f is executed with parameters p. Returns driver error status. |
| int TargHalt( ); | Stops target execution. Enters debug state. Returns driver error status. |
| int TargResetRun( ); | Reset, run. Returns driver error status. |
| int TargResetHalt( ); | Reset, stop it immediately. Returns driver error status. |
| int TargRun(int timeout); | Timeout is in milliseconds. Returns driver error status. |
| int TargRunAt(int timeout, addr); | Timeout is in milliseconds. Returns driver error status. |
| int TargStatus(string status); | Fills status with description of status. Returns driver error status. |
| int TargStep(int count); | Count is number of steps to take. Returns driver error status. |

These functions, in turn, utilize a standard JTAG driver 104, available from Macraigor Systems, LLC, Brookline Village, Mass., which bidirectionally translates between the library functions and of JTAG vectors through a physical instrumentation port 106. The supported basic operations provided by this particular driver correspond directly or in combination to the JTAG control functions implemented by the JTAG control library 102. The example presented in Table III illustrates a typically template-based reset initialization operation for an ARM processor.

TABLE III

Processor Initialize Template

```
// resetarm.htl - sample reset command for arm7tdmi
// assign a hardware breakpoint to handle all software breakpoints
main( )
{
    int value[6];
    value[0] = 0;
    value[1] = 0xFFFFFFFF;
    value[2] = 0xFEDEFEDE;
    value[3] = 0;
    value[4] = 0x100;
    value[5] = 0xF7;
    // do the reset
    TargResetHalt( );
    // assign hardware breakpoint to capture software breakpoints
    TargRegWrite( w0av, w0cm, 6, value );
    // set up a RAM location to cache debugger access to some
    coprocessor regs
    // ADDRESS is retrieved as the value of a control parameter
    "debugbase"
    TargSetRegBufAddr(getenv("debugbase" ));
}
```

The example presented in Table IV illustrates a template-based local memory test that checks representative memory locations by instrumentation manager 14 driven write/read operations, downloads a test routine implementing a high-speed test loop, and initiates execution of the test routine. The results of the test routine run are stored in CPU registers that are then read back for comparison with reference values by the instrumentation manager 14.

TABLE IV

Memory Test Template

```
// processor independent high speed memory check
// load target code
#if VPE_CPU_NAME = AU1000
#include "memchkAM3.h"
#endif
#if VPE_CPU_NAME = 4ke
#include "memchkMIPS.h"
#endif
#if VPE_CPU_NAME = EJTAG25_64bit
#include "memchkMIPS.h"
#endif
int TestMemLoc( int addr, int value );
int TestMemLoc( long addr, int value );
int TestMemRange( int start, int end, int value );
int TestMemRange( long start, long end, int value );
int TestMemFast( int start, int end, int value );
int TestMemFast( long start, long end, int value );
int Trace( int n );
int Trace64( int n );
// ----------------------------------------------------
// ----------------------------------------------------
main( int value )
{
    int i;
    TargHalt( );
    // check one memory location
```

TABLE IV-continued

Memory Test Template

```
    if( TestMemLoc( VPE_MEM_BANK, value ) == 1 ) return 0;
    // check all memory that will hold executable code
    if( TestMemRange( VPE_MEM_BANK,
    VPE_MEM_BANK + 0x40, value ) == 1 )
       return 0;
    // write memchk array to memory, set PC
    TargMemWrite( VPE_MEM_BANK, memchksize, memchk );
    // test 64K of memory with input value
    TestMemFast( VPE_MEM_BANK + 0x40,
VPE_MEM_BANK + 0x0000FFFF, value );
}
// ----------------------------------------------------
// check one memory location
// ----------------------------------------------------
int TestMemLoc( int addr, int value )
{
    int memdata[1];
    memdata[0] = value;
    TargMemWrite( addr, 1, memdata );
    TargMemRead( addr, 1, memdata );
    if( memdata[0] != value )
    {
        printf( "Start location test failed, result = 0x%08x vs. 0x%08x\n",
            memdata[0], value );
        return 1;
    }
    return 0;
}
// ----------------------------------------------------
// check one memory location
// ----------------------------------------------------
int TestMemLoc( long addr, int value )
{
    int memdata[1];
    memdata[0] = value;
    TargMemWrite( addr, 1, memdata );
    TargMemRead( addr, 1, memdata );
    if( memdata[0] != value )
    {
        printf( "Start location test failed, result = 0x%08x vs. 0x%08x\n",
            memdata[0], value );
        return 1;
    }
    return 0;
}
// ----------------------------------------------------
// check a range of memory locations
// ----------------------------------------------------
int TestMemRange( int start, int end, int value )
{
    int count = (end – start + 1) / 4 + 1;
    int memdata[count];
    int i;
    for( i=0; i < count; i++ )
        memdata[i] = value;
    TargMemWrite( start, count, memdata );
    TargMemRead( start, count, memdata );
    for( i=0; i < count; i++ )
    {
        if( memdata[i] != value )
        {
            printf( "Range test failed, offset %d,
                result = 0x%08x vs. 0x%08x\n", i, memdata[i], value );
            return 1 ;
        }
    }
    return 0;
}
// ----------------------------------------------------
// check a range of memory locations
// ----------------------------------------------------
int TestMemRange( long start, long end, int value )
{
    int count = (end – start + 1) / 4 + 1;
    int memdata[count];
    int i;
    for( i=0; i < count; i++ )
```

TABLE IV-continued

Memory Test Template

```
    memdata[i] = value;
    TargMemWrite( start, count, memdata );
    TargMemRead( start, count, memdata );
    for( i=0; i < count; i++ )
    {
      if( memdata[i] != value )
      {
        printf( "Range test failed, offset %d,
          result = 0x%08x vs. 0x%08x\n", i, memdata[i], value );
        return 1;
      }
    }
    return 0;
}
// ------------------------------------------------------------
// fast test a range of memory locations
// ------------------------------------------------------------
int TestMemFast( int start, int end, int value )
{
    int regval[1];
    int i;
    int memword[1];
    // set the PC
    regval[0] = VPE_MEM_BANK;
    TargRegWrite( pc, pc, 1, regval );
    TargRegRead( pc, pc, 1, regval );
    // load registers
    // t0 = pattern to write
    regval[0] = value;
    TargRegWrite( t0, t0, 1, regval);
    // t1 = start address
    regval[0] = start;
    TargRegWrite( t1 , t1 , 1 , regval );
    // t2 = end address
    regval[0] = end;
    TargRegWrite( t2, t2, 1, regval );
    // run till breakpoint
    printf( "\nFast Memory Test: first check 0x%08x to 0x%08x\n",
        start, end );
    TargRun( 10000 );
    TargRegRead( t1, t1, 1, regval );
    if( regval[0] != end + 1 )
    {
        printf( "****** FAILED: addr is 0x%08x vs 0x%08x\n",
            regval[0], end );
        TargRegRead( t3, t3, 1, regval );
        printf( "Value is 0x%08x, expected 0x%08x\n", regval[0], value );
        return 1;
    }
    else
        printf( "*** PASSED: 0x%08x to 0x%08x,
            test value 0x%08x\n", start, end, value );
        return 0;
}
// ------------------------------------------------------------
// fast test a range of memory locations
// ------------------------------------------------------------
int TestMemFast( long start, long end, int value )
{
    long regval[1];
    int i;
    int memword[1];
    // set the PC
    regval[0] = VPE_MEM_BANK;
    TargRegWrite( pc, pc, 1, regval );
    TargRegRead( pc, pc, 1, regval );
    // load registers
    // t0 = pattern to write
    regval[0] = value;
    TargRegWrite( t0, t0, 1, regval);
    // t1 = start address
    regval[0] = start;
    TargRegWrite( t1, t1, 1, regval );
    // t2 = end address
    regval[0] = end;
    TargRegWrite( t2, t2, 1, regval );
    // run till breakpoint
    printf( "Fast Memory Test Start...\n" );
    TargRun( 10000 );
    // read final address
    TargRegRead( t1, t1, 1, regval );
    if( regval[0] != end + 1 )
    {
        printf( "****** FAILED: addr is 0x%016l64x vs.
            expected 0x%016l64x\n", regval[0], end );
        TargRegRead( t3, t3, 1, regval );
        printf( "Value is 0x%016l64x vs. expected 0x%08x\n", regval[0],
            value );
        return 1;
    }
    else
        printf( "*** PASSED: 0x%016l64x to 0x%016l64x,
            test value 0x%08x\n",
            start, end, value );
        return 0;
}
int Trace( int n )
{
    int i;
    int regval[1];
    int memword[1];
    for( i=0; i<n; i++ )
    {
        TargStep(1);
        TargRegRead( pc, pc, 1, regval );
        TargMemRead( regval[0], 4, memword );
        printf( "PC = 0x%08x, opcode = 0x%08x\n",
            regval[0], memword[0] );
    }
}
int Trace64( int n )
{
    int i;
    long regval[1];
    int memword[1];
    for( i=0; i<n; i++ )
    {
        TargStep(1);
        TargRegRead( pc, pc, 1, regval );
        TargMemRead( regval[0], 4, memword );
        printf( "PC = 0x%016l64x, opcode = 0x%08x\n",
            regval[0], memword[0] );
    }
}
```

Figure 4:
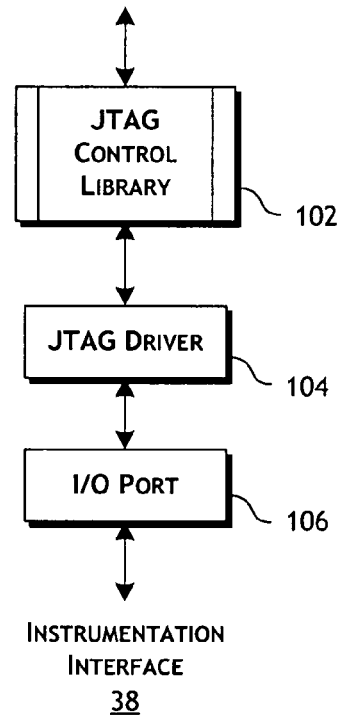
FIG. 4 provides an architecture block diagram illustrating a preferred implementation of an instrumentation controller in accordance with the present invention.

FIG. 4 illustrates a preferred architecture 110 for an instrumentation controller 16 constructed in accordance with the present invention. Primary management is implemented by a controller 112 that communicates with the instrumentation manager 14 using a Point-to-Point Validator Protocol (PPVP), implemented by a link layer 114. The PPVP protocol defines non-blocking remote procedure calls (RPC) used to encapsulate test data and control messages for exchange over the network connection 46 between the instrumentation manager 14 and instrumentation controller 16. A command line interface (CLI) 118 is also preferably provided to enable either locally or remotely connected 46' terminals to access and provide commands to the controller 112.

A port manager 120 preferably executes as a separate task used to manage the real-time data and control requirements of various PEM drivers $122_{1-N}$ that support the specific hardware operation of the PEMs $58_{1-N}$. In the preferred embodiments, the port manager 120 and PEM drivers $122_{1-N}$ are interrupt driven to ensure that the various PEMs $58_{1-N}$ operate at full rated speed. The PEM drivers $122_{1-N}$ preferably implement minimal data buffering and rely on the port manager 120 to primarily manage real-time data transfers between the PEMs $58_{1-N}$ and a dedicated I/O data buffer 124. As the real-time data transfer demands on the port manager 120 permit, test data can be transferred by the controller 112 between the instrumentation manager 14 and I/O data buffer 124 through the PPVP link 114.

The controller 112 operates as a test data server that responds to commands provided by the client instrumentation manager 14. The principal commands provide for the logical opening and closing of selected ports within the set of the then installed PEMs $58_{1-N}$ and transfer of test data. Individual ports are opened typically to enable the transfer of specific control and data signals between the instrumentation controller 16 and embedded system 12 during execution of a functional test by the instrumentation manager 14. Test patterned data may be sent to the instrumentation controller 16 for output through a selected port. Test data received from the various ports of the embedded system 12 is passed back to the instrumentation manager 16 for evaluation against reference result data 96.

Figure 5:
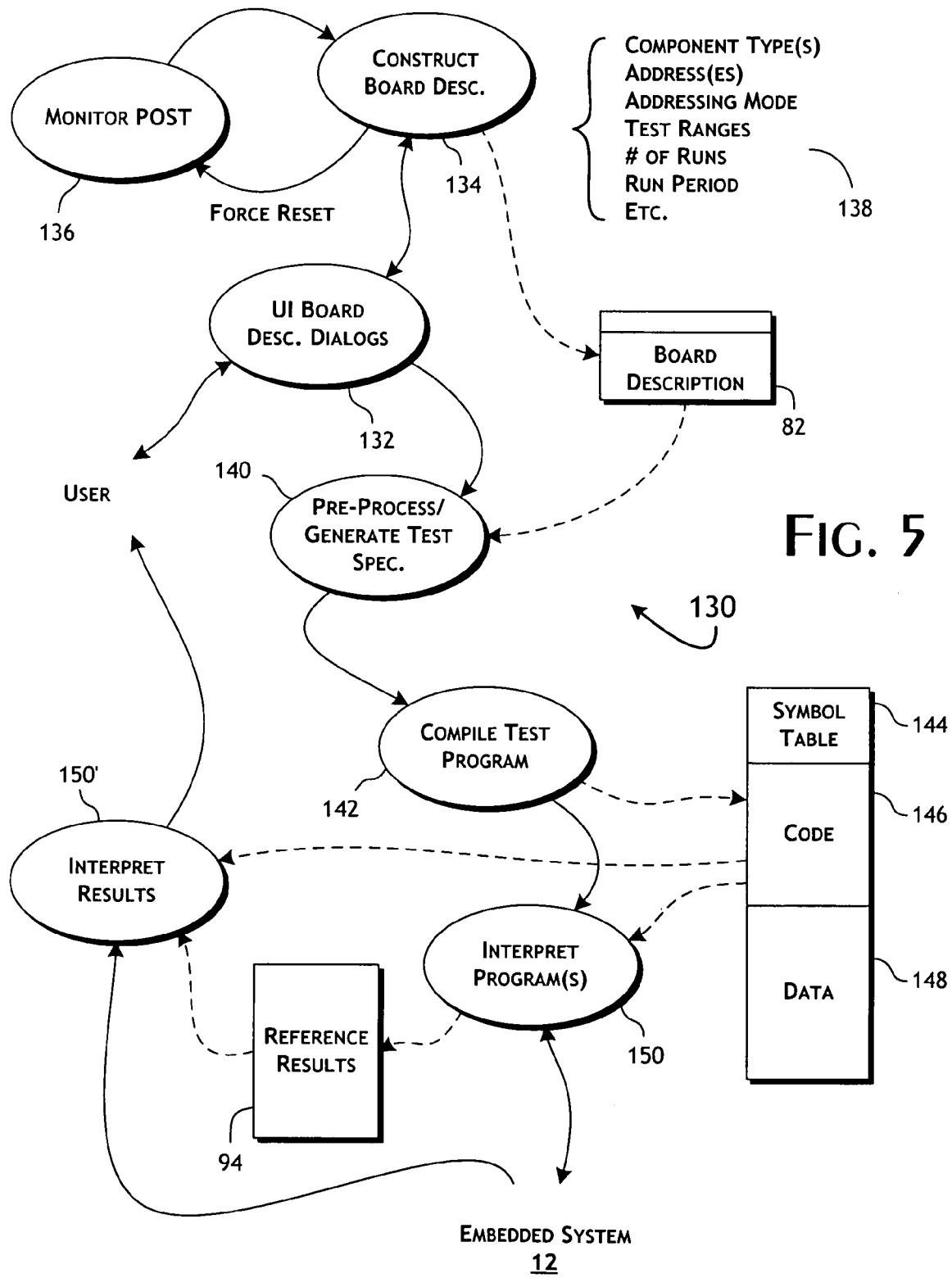
FIG. 5 is a software flow diagram describing the preferred dynamic functional test sequence construction and execution operations as implemented by an instrumentation manager in accordance with a preferred embodiment of the present invention.

A preferred process 130 of defining and performing a functional test of an embedded system 12 is shown in FIG. 5. Initially, a user will command 132 the construction 134 of a new board description 82 by identifying the different testable components present in the embedded system 12 and supplying as much design information, such as component base addresses, as reasonably possible. If the embedded system 12 hosts a POST process, the instrumentation manager 14 can direct a tracing of the POST operations to elicit further design specific information. Preferably, the embedded system 12 is reset and single-stepped through the POST to create a trace 136 establishing at least the values written to programmable registers present in the different embedded system 12 resident components. The user, alone or in combination with an analysis performed by the instrumentation manager, is then able to identify the remaining design specific information necessary to create the board description 82. In general, a POST trace 136 need be performed just once for a particular implementation of an embedded system. Subsequent function test runs can be based on an existing board description 82.

To initiate a particular functional test run for a particular embedded system 12, the user selects the corresponding board description 82 and further specifies dynamic or test run specific information 138. For example, the number of test cycles against a particular component, the pattern and quantity of data to be used in testing the same or different component, the sequence and frequency of tones to be tested through an analog port, the total number of test iterations to be performed, and other test control parameters may be specified dynamically. Test control parameters that specify the choice between optional aspects of different component test strategies can also be provided dynamically by the user in override of the component template defaults or static values stored as part of the board description 82. In accordance with the present invention, the functional test operations generated will fully reflect the stored board description 82 further qualified by any dynamically provided information 138.

The user then initiates a test run 140, resulting in the automatic preprocessing of the selected test configuration 84, referenced board description 82 and component templates 86, and any dynamically provided test control information 138 being resolved together to produce a test specification 92. For the preferred embodiments of the present invention, a test specification 92 is structured generally as shown in FIG. 6. The test specification structure 160 includes an initialization operation 162, followed by a sequence of component tests $164_{1-N}$, and a termination operation 166. The initialization operation 162 preferably corresponds to and implements the test strategies of the component template identified by type for the embedded processor 18. Typically, each of the component tests $164_{1-N}$ correspond to and implement the test strategies of component templates 86, including download, as needed, and execution of the incorporated test routines, for different components. Alternately, multiple component tests $164_{1-N}$ can be specified for a single component, thereby allowing different, potentially conflicting test strategies to be implemented in different component templates. The termination operation 166 preferably represents a generic component template that simply provides for a reset of the embedded system 12 to a known state.

The test specification is then compiled 142, incorporating as appropriate referenced test routines 90, to produce a test program 94 specific to the embedded system 12. For the preferred embodiment of the present invention, the test program 94, as compiled, includes a symbol table segment 144, code segment 146, and data segment 148. The symbol table 144 contains control information enabling execution of the code segment 146 and provides references into the data segment 148. The code segment 146 stores the byte-codes executable 150 to implement a particular test specification 160. The data segment 148 stores literal data and data objects. As determined through execution of the code segment 146, selected literal data and data objects, representing binary values and binary compiled test routines are applied or downloaded to the embedded system 12.

Other literal data and data objects can represent or be used, in execution of the code segment 146, to determine test reference results 96 anticipated in response to the performance of specific tests through execution of the code segment 146. That is, in accordance with the present invention, the execution of the code segment 146 provides for the production of the reference results 96 that can be used to verify the functional operation of specific components within the embedded system 12. The production of the reference results 96 can be literal, generated, or implied. A literal data string may be recorded as part of the reference results 96 against a port identifier where a particular component test $164_{1-N}$ of the corresponding component, if functioning correctly, will transfer of that data string. Where another component test $164_{1-N}$ provides for the automatic generation of data, an equivalent generation is computed by the executed byte-code and stored as a reference result against the port identifier. For example, a reference result zero-crossing count value is computed to verify the function of an audio component test driven to generate an audio tone for a defined time period. Finally, in cases where any response is adequate to establish functional operation of a component, the reference results may be implied for that component. For example, a component test $164_{1-N}$ intended to test receipt of an externally provided data strobe signal on a parallel port can be confirmed as functional on transfer of any data value. The various reference result 96 values and information need not be copied separate from the data segment 148, but preferably logically established through the execution 150' of the code segment 146 when examining the results of the component tests $164_{1-N}$. In the preferred embodiments of the present invention, as each component test $164_{1-N}$ is executed 150, the results are sequentially evaluated 150' and presented to a user.

A preferred process flow 170 for executing component tests $164_{1-N}$ is shown in FIG. 7. Once the test program 94 execution has initialized, the component tests $164_{1-N}$ are sequentially executed. The function performed in component test $164_{1-N}$ initialization 174 will depend on the test requirements. Preferably, for complex and speed dependent tests, the test initialization 174 will reset the embedded processor 18, test and clear an area in the local memory 22, and download a test routine 176 into the local memory 22. In connection with the download, applicable test control parameters are provided and any non-relative addresses are updated to reflect the base load address of the test routine 176 in the local memory 22.

Commands are then sent 180 to the instrumentation controller 16 to initialize and open ports corresponding to the particular PEMs 58$_{1-N}$ required to support the component test function or functions implemented by the test routine 176. Further commands are sent to the instrumentation controller to specify or provide, as appropriate, the amount and controlled conditions under which data that is to be transferred through the PEMs 58$_{1-N}$. The anticipated reference result data is concurrently established 178.

Commands are then sent to the embedded system 12 via the instrumentation interface 36 to execute 182 the test routine 176. Where the test routine 176 requires externally applied data values or control signals, further commands are sent to the instrumentation controller 16 to initiate the operation through a corresponding PEM 58$_{1-N}$. The port manager 120 monitors 186 the detailed operation of the PEMs 58$_{1-N}$ and passes the corresponding information to the controller 112. Preferably, as the test routine 176 executes, commands are sent to the instrumentation controller 16 to retrieve collected status and other operative information. The retrieved information is parsed and compared to the reference results 96 and, at a minimum, a pass/fail report 188 is returned to the user.

By downloaded direct execution of the test routine 176 by the embedded processor 18, the test function is performed at full processor speed and across the full data and control paths involving the embedded processor 18, firmware 20, local memory 22, embedded components 24, 26, 28, 30. With the responsive data and control support provided by the PEMs 58$_{1-N}$, the test routine 176 is also able to test the full data and control paths between the embedded components 26, 28, 30 implementing externally accessible ports and the corresponding physical connectors 32, 34, 36.

Downloaded execution of a test routine 176 is not, however, required in order to perform full functional testing. Instead, the test program 94 can interact with the embedded components 20, 22, 24, 26, 28, 30 directly through the instrumentation interface 38 or indirectly through single-stepped operation of the embedded processor 18. Direct control is desirable where specific tests can be performed through immediate register operations. For example, register accesses can test whether included register bits are writable. Together with an appropriately selected PEM 58$_{1-N}$, direct register accesses can further test whether individual register bits control or reflect the state of externally accessible control and data lines.

Thus, a system and methods for performing full functional testing of embedded systems has been described. In view of the above description of the preferred embodiments of the present invention, many modifications and variations of the disclosed embodiments will be readily appreciated by those of skill in the art. It is therefore to be understood that, within the scope of the appended claims, the invention may be practiced otherwise than as specifically described above.

The invention claimed is:

1. An automated test system providing for the functional testing of an embedded system, wherein said embedded system implements an embedded processor unit and local memory, and a peripheral component coupled to an external interface port of predefined type, said automated test system comprising:
   a) a peripheral emulation module including port controller implementing an test interface port of predefined type coupleable to said external interface port; and
   b) a test control system coupled to said peripheral emulation module, said test control system including:
      i) a test generation processor coupled to access a plurality of component test templates and responsive to embedded system description data specific to said embedded system including said peripheral component, wherein said test generation processor is operative to autonomously compile a test program derivative of said component test templates resolved specific to said embedded processor unit and said peripheral component based on said embedded system description data; and
      ii) a test execution processor operative to autonomously execute said test program, wherein execution of said test program provides for the operation of said embedded processor unit to cause the transfer of test data through said external interface port, wherein execution of said test program provides for comparison of predetermined reference data to said test data, wherein said predetermined reference data is incorporated in said test program derivative of said component test templates resolved specific to said peripheral component based on said embedded system description data, whereby autonomous comparison of said predetermined reference data and said test data is reflective of the correct operation of said embedded system.

2. The automated test system of claim 1 wherein said test execution processor is further operative to provide a test routine within the local memory of said embedded system and to enable execution of said test routine by said embedded processor unit to cause the transfer of test data through said external interface port.

3. The automated test system of claim 2 wherein said test routine is associated with said test program by said test generation processor.

4. The automated test system of claim 2 wherein said test routine is incorporated into said test program by said test generation processor, said test routine being derivative of said component test templates resolved specific to said embedded processor unit and said peripheral component based on said embedded system description data.

5. The automated test system of claim 4 wherein predetermined component test templates of said plurality of component test templates correspond to said embedded processor unit and said peripheral component, wherein said embedded system description data includes design specific addressing data operatively relating said peripheral component with said embedded processor unit as implemented within said embedded system, said test generation processor being operative to resolve said predetermined component template with said design specific addressing data to provide said test program.

6. The automated test system of claim 5 wherein said test execution processor, through execution of said test program, determines said predetermined reference data.

7. A method of performing automated testing of embedded systems, wherein said embedded system includes a processor and local memory, and a peripheral component coupled to an external interface port of predefined type, said method providing for the automated generation and execution of test procedures and for the verification of test results in automatic correspondence with said test procedures, said method comprising the steps of:
   a) processing embedded system definition data, including a board definition file, identifying a plurality of embedded system components in combination with a plurality of component templates to produce a sequence of test procedures in specific correspondence with said embedded system, wherein said component templates contain functionally abstracted test operations and wherein said embedded system definition data includes predefined component specific values, said step of processing autonomously resolving said functionally abstracted test operations with said predefined component values to produce said sequence of test procedures;

b) compiling said sequence of test procedures to produce an executable program implementing said sequence of test procedures, said plurality of component templates corresponding to said plurality of embedded system components respectively incorporating test specifications autonomously compilable to corresponding portions of said executable program; and c) executing said executable program with respect to said embedded system wherein first and second portions of said executable program respectively test first and second components of said embedded system to produce respective test result data, wherein execution of said first and second portions autonomously provides respective reference data reflective of said predefined component values, and wherein execution of said first and second portions autonomously compares said respective test result data with said respective reference data to verify the respective operation of said first and second components.

8. The method of claim 7 wherein said steps of compiling and executing are performed automatically following said step of processing to immediately implement testing of said embedded system.

9. The method of claim 8 wherein said step of processing includes the steps of selecting said embedded system definition data and of initiating a test run by concluding said step of processing.

10. The method of claim 9 wherein said step of executing includes processing of said respective reference data to enable comparison with said respective test result data.

11. An automated test system providing for the functional testing of an embedded system, wherein said embedded system implements an embedded processor unit, firmware and local memory, and a peripheral component coupled to an external interface port of predefined type, said automated test system comprising:

a) a peripheral emulation module including port controller implementing an test interface port of predefined type coupleable to said external interface port; and b) a test control system coupled to said peripheral emulation module, said test control system including:

i) a data store containing a plurality of component test templates including abstract test procedures, a board description identifying a predefined set of said component test templates, said predefined set corresponding to said embedded system, said board description further including embedded system description data usable to resolve said predefined set specific to said embedded system and embedded system test data usable to resolve said abstract test procedures corresponding to said predefined set to specific test operations; and ii) a test control processor coupled to said data store operative to autonomously compile a test program derivative of said predefined set resolved specific to said embedded system dependent on said embedded system description data and said embedded system test data, wherein execution of said test program provides for the transfer of test execution data through said peripheral component and said external interface port, wherein execution of said test program further provides for autonomous collection and comparison of said test execution data as transferred through said external interface port with said embedded system test data to produce comparison results, said test control system providing output data reflective of said comparison results correlated to said embedded system and said peripheral component.

12. The automated test system of claim 11 wherein said automated test system further comprises an instrumentation interface coupleable to an instrumentation port provided by said embedded system.

13. The automated test system of claim 12 wherein said instrumentation interface is coupleable to a JTAG-based instrumentation port provided by said embedded system.

14. The automated test system of claim 12 wherein said instrumentation interface is coupleable to a BDM-based instrumentation port provided by said embedded system.

15. The automated test system of claim 12 wherein said board description and said embedded system description data is operatively derived by said test control processor through observation of the execution of said firmware by said embedded system processor unit.

16. The automated test system of claim 15 wherein said component test templates of said predefined set include test routines and wherein said test control program provides for the autonomous compilation of said test routines into said test program wherein execution of said test program provides for the selective download of said test routines into said local memory for execution by said embedded system processor unit, whereby execution of a predetermined test routine provides for the transfer of said test execution data through said external interface port.

17. The automated test system of claim 16 wherein status data reflective of the execution of said predetermined test routine is retrievable by said test control system through said instrumentation interface.

18. The automated test system of claim 17 wherein said status data is comparable by said test control system with said embedded system test data to produce said comparison results.

* * * * *